United States Patent [19]

Miura

[11] Patent Number: 4,884,125
[45] Date of Patent: Nov. 28, 1989

[54] HYBRID INTEGRATED CIRCUIT DEVICE CAPABLE OF BEING INSERTED INTO SOCKET

[75] Inventor: Norio Miura, Gunma, Japan

[73] Assignee: Sanyo Electric Co., Ltd., Japan

[21] Appl. No.: 107,990

[22] Filed: Oct. 13, 1987

[30] Foreign Application Priority Data

| Oct. 15, 1986 | [JP] | Japan | 61-244371 |
| Oct. 17, 1986 | [JP] | Japan | 61-247924 |
| Oct. 17, 1986 | [JP] | Japan | 61-247925 |
| Oct. 17, 1986 | [JP] | Japan | 61-159714 |
| Oct. 17, 1986 | [JP] | Japan | 61-159715 |
| Oct. 20, 1986 | [JP] | Japan | 61-160393 |
| Nov. 17, 1987 | [JP] | Japan | 61-176217 |

[51] Int. Cl.⁴ .................... H01L 23/12; H01L 29/52
[52] U.S. Cl. .............................. 357/74; 357/68
[58] Field of Search ................ 357/68, 74, 80, 81

[56] References Cited

U.S. PATENT DOCUMENTS

| 4,503,452 | 3/1985 | Yokozawa et al. | 357/74 |
| 4,524,238 | 6/1985 | Butt | 357/74 |
| 4,715,115 | 12/1987 | King et al. | 357/74 |
| 4,805,009 | 2/1989 | Pryor et al. | 357/74 |

*Primary Examiner*—Gene M. Munson
*Attorney, Agent, or Firm*—Darby & Darby

[57] ABSTRACT

A hybrid integrated circuit device comprises a metal substrate, a casing member and external leads. An insulating film is formed on the metal substrate, conductive paths are formed on the insulating film, circuit elements are connected to the conductive paths, and conductive pads are formed in the tip portions of the conductive paths. The casing member comprises a sealing portion surrounding the circuit elements and a connector portion projected from the bottom portion of the sealing portion and extending beyond an end of the metal substrate, and formed of insulating resin. Each of the external leads has one end connected to each of the conductive pads and supported by the side surface of the connector portion.

13 Claims, 21 Drawing Sheets

HYBRID INTEGRATED CIRCUIT DEVICE CAPABLE OF BEING INSERTED INTO SOCKET

BACKGROUND OF THE INVENTION

1. Field of the Invention

The present invention relates to a hybrid integrated circuit device and more particularly, to an improvement of a hybrid integrated circuit device capable of being directly inserted into a socket.

2. Description of the Prior Art

Conventionally, a ceramics substrate or a metal substrate has been used in a hybrid integrated circuit device. However, a metal substrate is mainly used since it has good heat radiating capability and mechanical strength. FIG. 1 is a diagram showing a conventional hybrid integrated circuit device using a metal substrate which is disclosed in Japanese Utility Model Publication No. 3645/1977. Referring to FIG. 1, a metal substrate 1 comprises an aluminum substrate, and an aluminum oxide film 2 is formed on the surface of the metal substrate 1 by anodic oxidation. An insulating layer 3 is formed of resin such as epoxy resin on the aluminum oxide film 2. In addition, copper foil is adhered on the insulating layer 3. The copper foil is etched to be a pattern of a desired shape, so that conductive paths 4 are formed. A plurality of circuit elements 5 are formed on the conductive paths 4. External leads 7 are connected to pads 6 in a tip portion of the conductive paths 4, with constant spacing between the leads.

FIG. 2 is a diagram showing a hybrid integrated circuit device comprising two metal substrates, which is disclosed in Japanese Patent Publication No. 35817/1971. Referring to FIG. 2, metal substrates 9 and 9a provided with circuit elements 8 and 8a are fixed on the upper end and the lower end of a frame member 10, respectively so that the circuit elements 8 and 8a are opposed to each other. External leads 11 and 11a are connected to the ends of the metal substrates 9 and 9a, respectively, with constant spacing.

When such a hybrid integrated circuit device is connected to a print board, external leads 13 of a hybrid integrated circuit device 12 are inserted into holes 15 of a print board 14 and soldered, as shown in FIG. 3. Alternatively, a hybrid integrated circuit device 19 itself comprising a ceramics substrate 18 is inserted into a slit 17 provided in a print board 16, and the substrate 18 and the print board 16 are directly soldered, as shown in FIG. 4. Such a hybrid integrated circuit device is disclosed in Japanese Patent Laying-Open Gazettes No. 92595/1984 or No. 149082/1984.

FIG. 5 is a diagram showing another example of a conventional hybrid integrated circuit device to be inserted into a print board. Referring to FIG. 5, a hybrid integrated circuit device 21 comprises a first substrate 22 and a second substrate 23. The first substrate 22 is adapted such that conductive paths 25 each having a desired shape are formed on a metal substrate 24 having a good heat conductive capability, and circuit elements 26 such as a transistor, a resistor and a diode are provided on the conductive paths 25. The second substrate 23 is adapted such that conductive paths 28 each having a desired shape are formed on an insulating substrate such as a print board 27 as in the first substrate 22, and a large-sized capacitor, a resistor and the like which have been conventionally used as parts externally provided are attached on the conductive paths 28. In he hybrid integrated circuit device 21, the side surface of the first substrate 22 comes into contact with the side surface of the second substrate 23, pads provided in the respective ends of the first substrate 22 and the second substrate 23 are soldered using metallic leads 29, a lid 30 is connected to regions A and B enclosed by dotted lines, so that the first substrate 22 and the second substrate 23 are formed integrally with each other. As shown in FIG. 6, two framed portions 301 and 302 of the lid 30 are connected to the first substrate 22 and a frame portion 303 thereof is connected to the second substrate 23. Such a technique is disclosed in Japanese Patent Publication No. 45078/1982.

However, the conventional hybrid integrated circuit device presents the following various problems. In the structure shown in FIG. 3, the external leads 13 each having a width of about 2 mm derived from the metal substrate 12 is liable to be deformed during the carriage. If and when the deformation is produced, the external leads 13 can not be automatically inserted into the holes 15 of the print board 14 by an automatic inserting apparatus.

In the structure as shown in FIG. 4, since terminals are provided on the surface of the substrate and external leads are omitted, the above described problem can be solved if the substrate to be inserted into the print board comprises an insulating material. However, if and when the metal substrate is inserted into the slit provided in the print board, the slit should be formed to be slightly larger than the outside diameter of the metal substrate so that the metal substrate is easily inserted. Therefore, there is a space between the metal substrate and the slit, so that it is difficult to solder each of the electrodes. In addition, when the metal substrate is inserted, an insulating film of the metal substrate is liable to be torn, so that the electrodes of the metal substrate and the print board are liable to be electrically connected to each other, resulting in a short-circuited state. Therefore, the hybrid integrated circuit device can not be used for high breakdown voltage and large current.

In the structure as shown in FIG. 5 in which the first substrate 22 comprising a metal substrate and the second substrate 23 comprising a print board are formed integrally with each other, the above described problem can be solved because the portion to be inserted into the print board is a print board (insulating material). However, since such an integral type of hybrid integrated circuit device comprising a metal substrate and a print board is formed integrally only by the lid 30, mechanical strength is very low. In addition, since the first substrate 22 and the secnd substrate 23 must be connected to each other by leads, there is a problem in working ability or the reliability of the connecting portion.

Furthermore, since the coefficients of thermal expansion of the metal substrate and the print board significantly differ from each other, the print board is distorted, so that the connecting portion of leads are disconnected.

SUMMARY OF THE INVENTION

A primary object of the present invention is to provide an improved hybrid integrated circuit device comprising a metal substrate, which is suitable for automatic insertion into a socket.

Briefly stated, according to the present invention, a casing comprising a sealing portion surrounding circuit elements provided on the metal substrate and connected to the metal substrate and a connector portion projected from the sealing portion approximately parallel with the metal substrate and extending beyond an end of the metal substrate is formed of an insulating material, and external leads are supported on the side surface of the connector portion in the casing. In accordance with another aspect of the present invention, the external leads are folded with respect to the tip portion of the connector portion so as to extend to the opposite side of the connector portion. In accordance with still another aspect, the external leads are disposed in notched portions formed on one side surface or the other side surface of the connector portion. In accordance with still another aspect, the tip portions of the external leads are inserted into an opening formed on one side surface or the other side surface of the connector portion. In accordance with still another aspect, the external leads are flexible. In accordance with still another aspect, the hybrid integrated circuit device comprises two metal substrates and the connector portion is provided between the substrates and the external leads are disposed on both the surfaces of the connector portion. In accordance with still another aspect, the external leads are alternately arranged and folded with respect to the tip portion of the connector portion so as to extend to the opposite surface of the connector portion. In accordance with still another aspect, at least a pair of external leads opposed to each other is electrically connected to each other in the tip portion of the connector portion.

According to the present invention, since a connector portion comprising an insulating material is provided in the hybrid integrated circuit device, the hybrid integrated circuit device is handled in the same manner as that in a print board and insertion cna be simply made. In addition, since the external leads are supported by the connector portion, the leads are prevented from being bent, so that the connector portion can be automatically inserted into the print board by an automatic inserting apparatus. Furthermore, according to the present invention, since a plurality of substrates having different properties are connected integrally as a simple substrate and are connected to a casing member, a single metal substrate and the casing member are connected to each other, as compared with the prior art in which the effect of distortion or the like caused by the difference in thermal expansion can be neglected. Furthermore, since the hybrid integrated circuit device comprising two metal substrates has both surfaces covered with metal, the shielding effect is increased and the radiating effect is improved. Additionally, since circuit elements can be mounted on the two substrates, mounting can be achieved in high density.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
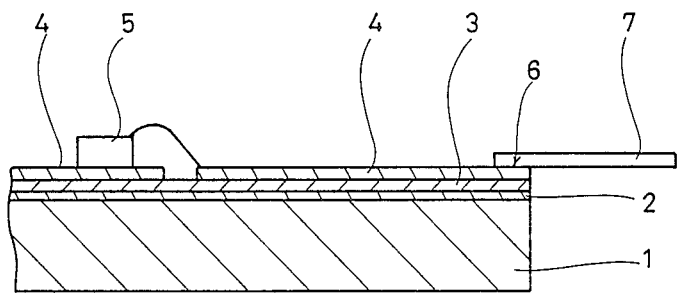
FIG. 1 is diagram showing a conventional hybrid integrated circuit device using a metal substrate.
Figure 2:
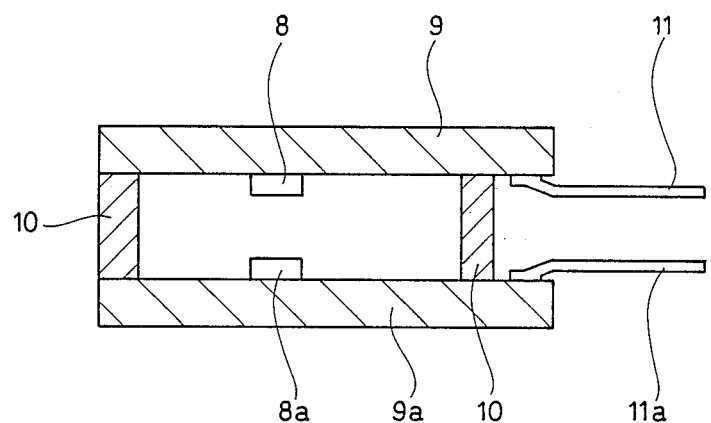
FIG. 2 is a diagram showing a conventional hybrid integrated circuit device comprising two metal substrate.
Figure 3:
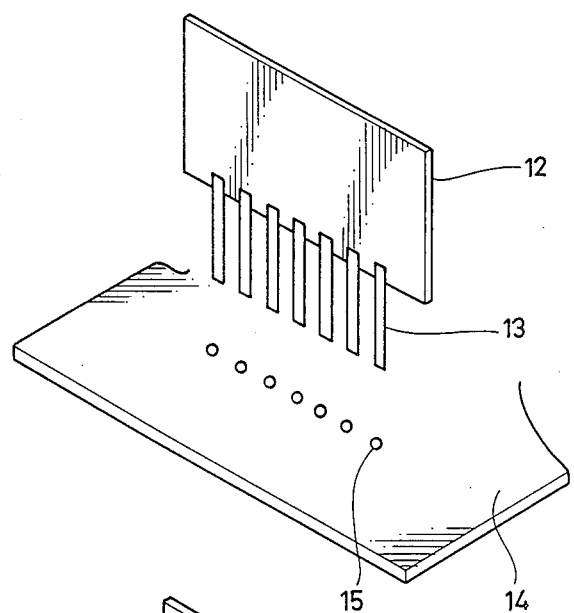
FIGS. 3 and 4 are diagrams for explaining a method for connecting a conventional hybrid integrated circuit device to a print board.
Figure 4:
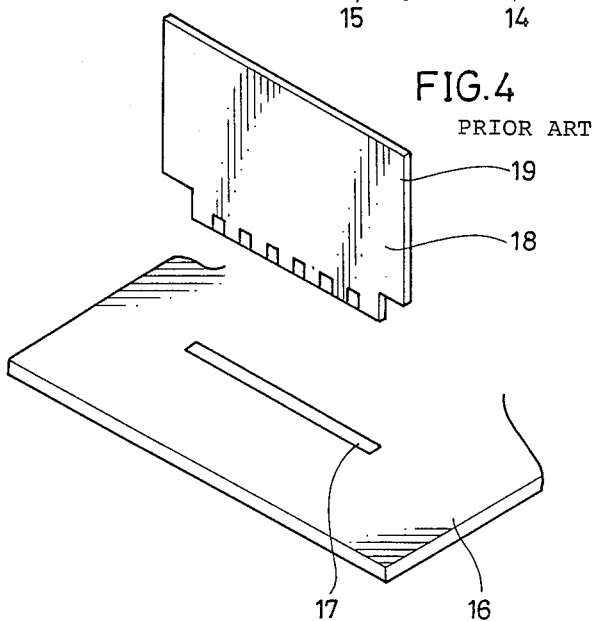
Figure 5:
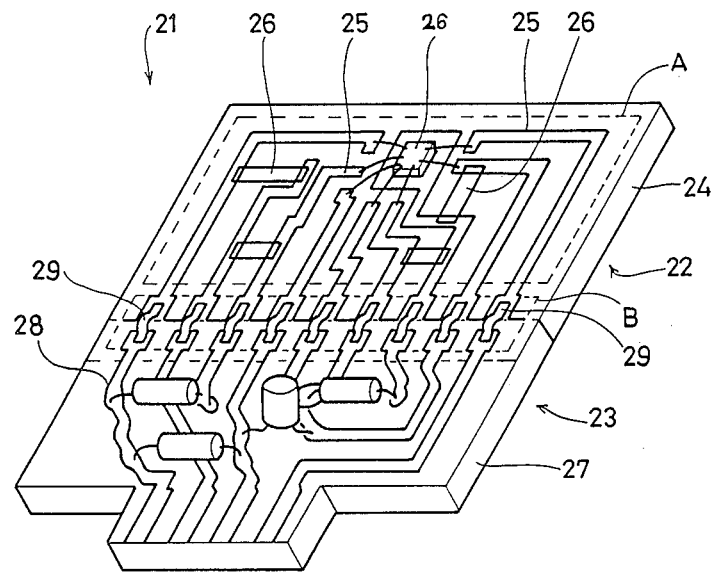
FIG. 5 is a diagram showing another example of a conventional hybrid integrated circuit device to be inserted into a print board.
Figure 6:
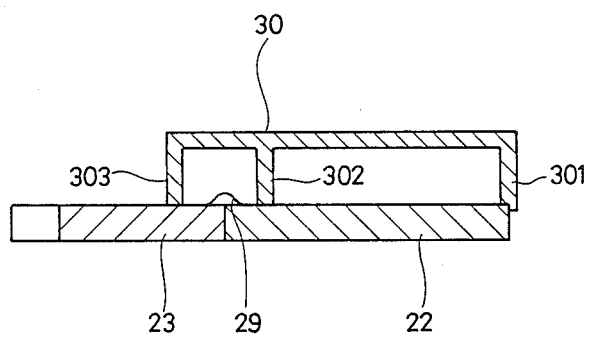
FIG. 6 is a diagram showing the connection between a conventional hybrid integrated circuit device comprising a metal substrate and a print board with a lid.

Referring to the drawings, embodiments of the present invention are described in detail.

[First Embodiment]

Figure 7:
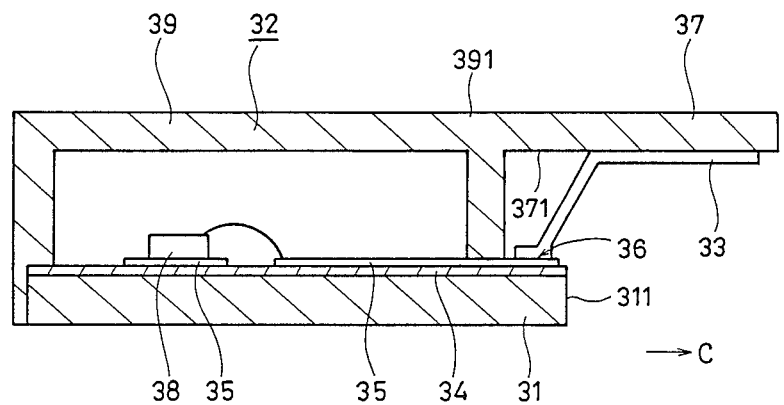
FIG. 7 is a cross sectional view showing a hybrid integrated circuit device according to a first embodiment of the present invention.
Figure 8:
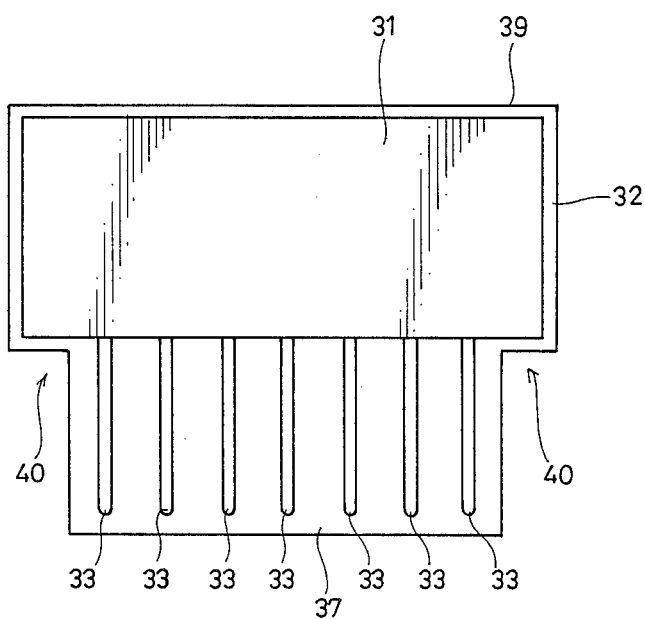
FIG. 8 is a plan view of the hybrid integrated circuit device shown in FIG. 7.

FIG. 7 is a cross sectional view of a hybrid integrated circuit device according to a first embodiment of the present invention, and FIG. 8 is a plan view thereof. The hybrid integrated circuit device according to the present invention comprises a metal substrate 31, a casing member 32 and external leads 33.

The metal substrate 31 comprises, for example, an aluminum substrate. An aluminum oxide film is formed on the surface of metal substrate 31 by anodic oxidation. An insulating film 34 is formed of resin such as epoxy resin or polyimide resin on the aluminum oxide film. In addition, copper foil is adhered on the insulating film 34. The copper foil is etched to be a desired pattern, so that conductive paths are formed. The conductive paths 35 extend along one major surface of the substrate 31 (in the direction of an arrow C in FIG. 7), and a plurality of conductive pads 36 to which external leads 33 are connected are formed in the tip portions thereof. As shown in FIG. 8, since a connector portion 37 is not provided in both ends 40 of the substrate 31, it should be considered that the conductive pads 36 are not formed around the corners of the substrate 31, so that the external leads 33 are arranged only on the connector portion 37 in the casing member 32. A plurality of circuit elements 38 such as a semiconductor integrated circuit, a transistor and a chip part are connected to the conductive paths 35.

The casing member 32 comprises a sealing portion 39 surrounding the circuit elements 38 and the connector portion 37 supporting the external leads 33. The casing member 32 is injection-molded using insulating resin.

The sealing portion 39 may have an arbitrary shape surrounding the circuit elements 38. According to the present embodiment, the sealing portion 39 is formed in a box shape to fix the circumference excluding the pads 36 of the metal substrate 31 and hermetically seal the circuit elements 38. The connector portion 37 is formed in the shape projected form a bottom portion 391 of the box-shaped sealing portion 39 and extending beyond an end 311 of the metal substrate 31.

The connector portion 37 is formed to be projected from the end 311 of the metal substrate 31 as described above, and the external leads 33 derived from the metal substrate 31 are arranged to contact a surface 371 (referred to as major surface hereinafter) opposed to the metal substrate 31. The external leads 33 may be fixed to the major surface 371 of the connector portion 37.

Additionally, as seen from FIG. 8, the connector portion 37 is formed to be narrowed than the sealing portion 39 for sealing the circuit elements 38. The width of the connector portion 37 can be arbitrarily changed according to the usage. In addition, the connector portion 37 is formed to be as thick as or thinner, by the thickness of the external leads 33 than a print board into which the connector portion is to be inserted. Furthermore, stepped portions 40 formed by the sealing portion 39 and the connector portion 37 serve as stoppers when the connector portion is inserted into the print board.

One end of the external lead 33 is soldered on the conductive pads 36 and bent to be directed to the connector portion 37 from the end so that the external leads 33 contact the connector portion 37 in a region from the intermediate portion to near the tip portion of the connector portion 37. In addition, the case member 32 is bonded and fixed to the metal substrate 31 by an arbitrary adhesive. In the present embodiment, an adhesive comprises an adhesive sheet.

Figure 9:
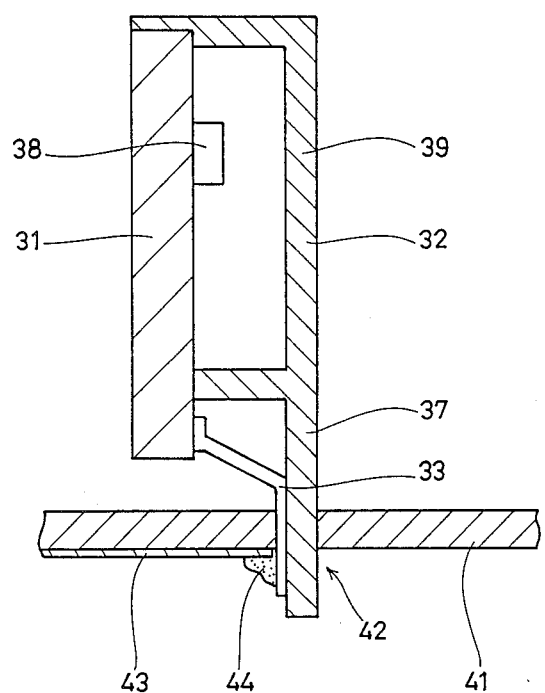
FIG. 9 is a cross sectional view of the hybrid integrated circuit device shown in FIG. 7 which is inserted into a print board.

FIG. 9 is a cross section view of the hybrid integrated circuit device according to the present embodiment which is inserted into a print board 41. Referring to FIG. 9, the connector portion 37 in the casing member 32 is inserted into an insertion hole 42 of the print board 41, and the external lead 33 is connected to an electrode 43 of the print board 41 by solder 44.

Thus, since the external lead 33 extending from the metal substate 31 contact the connector portion 37, the external lead 33 is supported by the connector portion 37, so that the external lead 33 is not deformed by external force. Thus, the connector portion can be automatically inserted into the print board using an automatic inserting apparatus. In addition, since both the connector portion and the print board comprise insulating materials, an IC requiring large current and high breakdown voltage can be employed.

[Second Embodiment]

Figure 10:
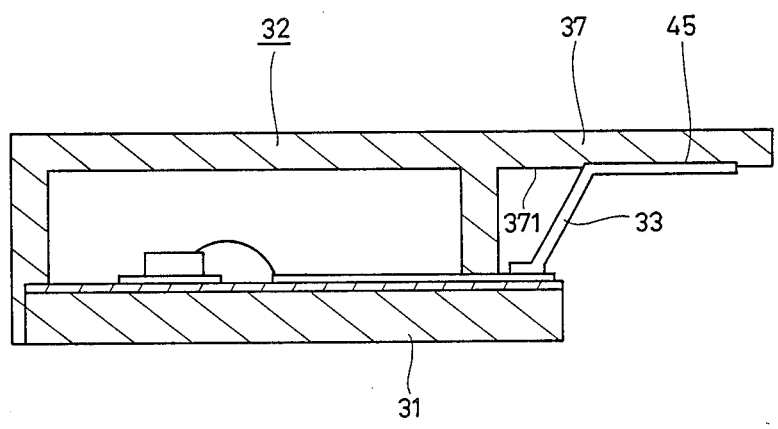
FIG. 10 is a cross sectional view showing a hybrid integrated circuit device according to a second embodiment of the present invention.
Figure 11:
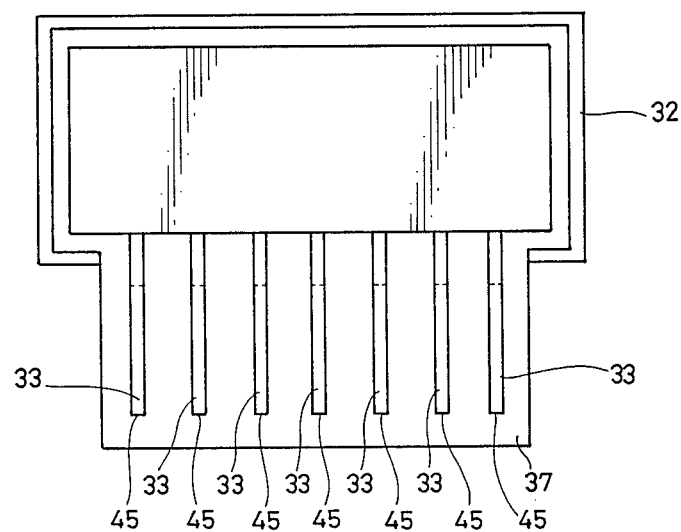
FIG. 11 is a plan view of the hybrid integrated circuit device shown in FIG. 10.

The second embodiment is illustrated in FIGS. 10 and 11. FIG. 10 is a cross sectional view of a hybrid integrated circuit device according to the present embodiment, and FIG. 11 is a plan view thereof. The present embodiment is an improvement of a connector portion 37. In the present embodiment, notched portions 45 are provided in the intermediate portion of a major surface 371 of the connector portion 37 which an external lead 33 contacts, at the same pitch as the external leads 33. The external leads 33 are disposed in the notched portions 45. As a result, since the external leads 33 are limited in movement by the notched portions 45, offset of the leads 33 can be prevented.

[Third Embodiment]

Figure 12:
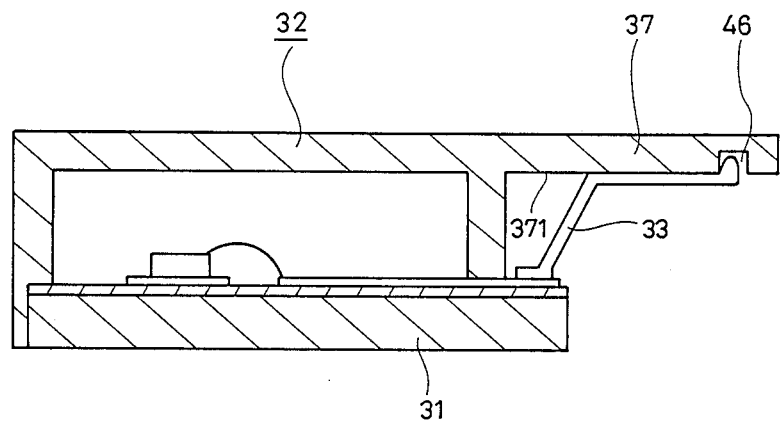
FIG. 12 is diagram showing a hybrid integrated circuit device according to a third embodiment of the present invention.

FIG. 12 illustrates a third embodiment. The present embodiment is an improvement of a connector portion 37. In the present embodiment, a hole 46 is provided near the tip portion on a major surface 371 of the connector portion 37 which an external lead 33 contacts, at the same pitch as the external leads 33. The tip portions of the external leads 33 are bent toward and inserted into the hole 46, so that the same effect of preventing offset as described above can be obtained.

[Fourth Embodiment]

Figure 13:
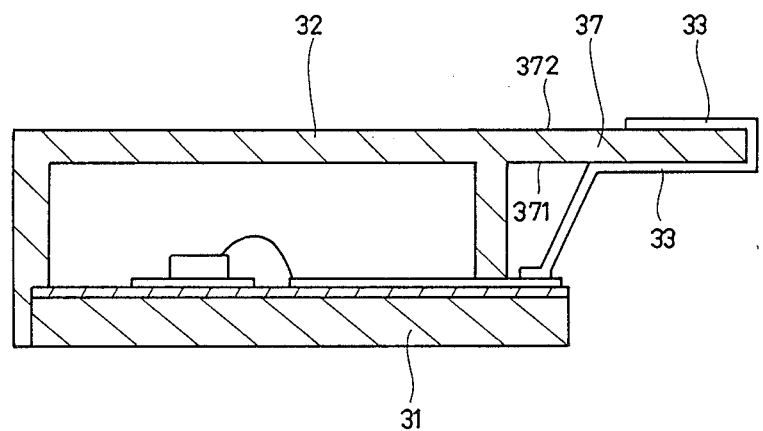
FIG. 13 is a cross sectional view showing a hybrid integrated circuit device according to a fourth embodiment of the present invention.
Figure 14:
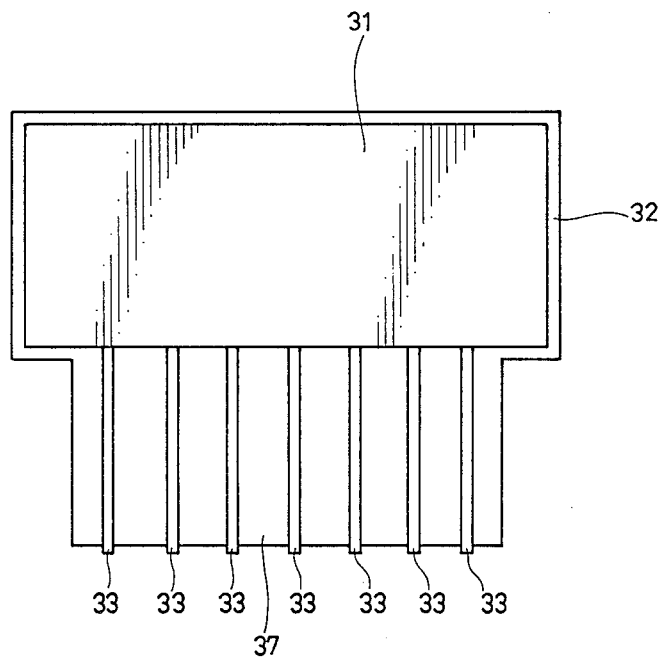
FIG. 14 is a plan view of the hybrid integrated circuit device shown in FIG. 13.
Figure 15:
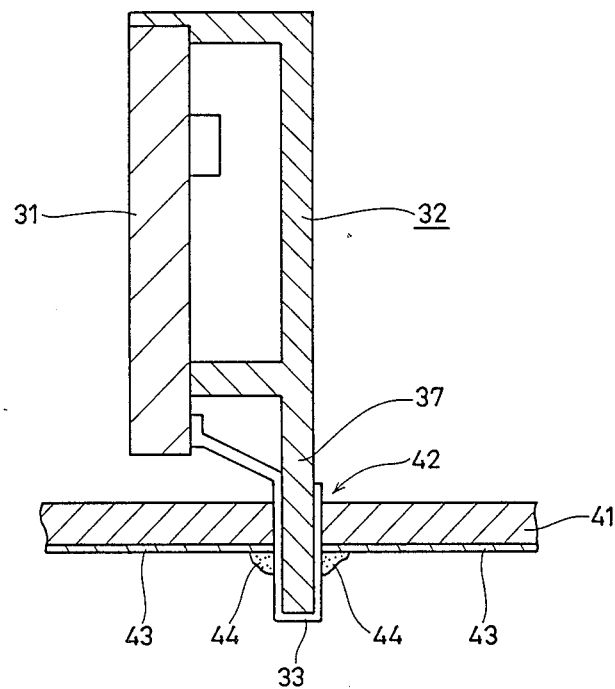
FIG. 15 is a cross sectional view of the hybrid integrated circuit device shown in FIG. 13 which is inserted into a print board.

A fourth embodiment is illustrated in FIGS. 13, 14 and 15. FIG. 13 is a cross sectional view of a hybrid integrated circuit device according to the present embodiment, FIG. 14 is a plan view thereof, and FIG. 15 is a cross sectional view of the hybrid integrated circuit device inserted into a print board according to the present embodiment. The present embodiment is an improvement of external leads 33 which contact a connector portion 37, wherein the external leads 33 which contact the connector portion 37 extend to a surface 372 opposite to a major surface 371 of the connector portion 37 along the outer surface of the connector portion 37. When the hybrid integrated circuit device according to the present embodiment is inserted into a print board, the connector portion 37 in a casing member 32 is inserted into an insertion hole 42 of a print board 41, and the external leads 33 are connected to an electrode 43 of the print board 41 by solder 44. Thus, since the external leads 33 are disposed on both surfaces of the connector poriton 37, the connection area of the external leads 33 is increased. For example, since curernt of 10 A to 40 A can be passed, the hybrid integrated circuit device can be employed with large current.

[Fifth Embodiment]

Figure 16:
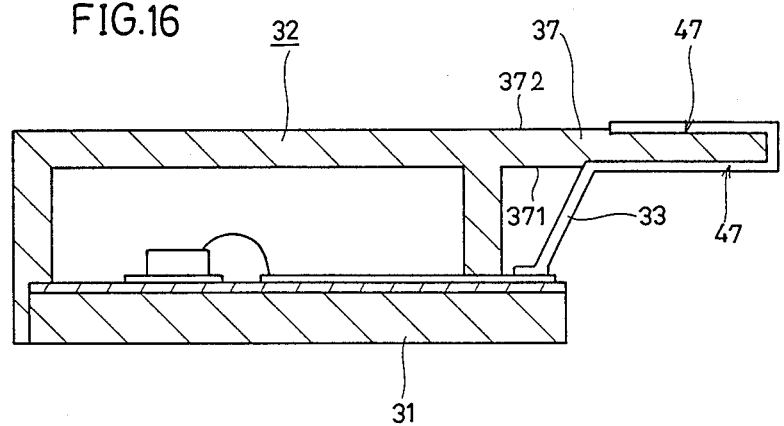
FIG. 16 is a cross sectional view showing a hybrid integrated circuit device according to a fifth embodiment of the present invention.
Figure 17:
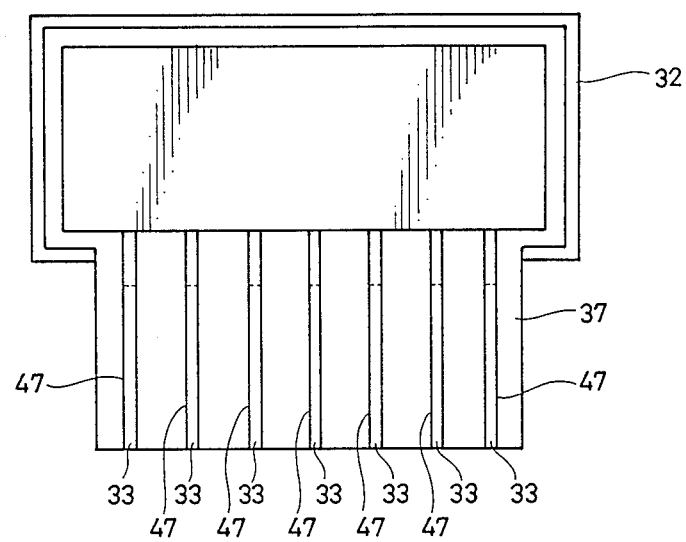
FIG. 17 is a plan view of the hybrid integrated circuit device shown in FIG. 16.

A fifth embodiment is illustrated in FIGS. 16 and 17. FIG. 16 is a cross sectional view of a hybrid integrated circuit device according to the present embodiment, and FIG. 17 is a plan view thereof. The present embodiment is a further improvement of the connector portion 37 shown in FIGS. 13 and 15. According to the present embodiment, notched portions 47 are formed from the tip portions to the central portions on both surfaces, that is, surfaces 371 and 372 of teh connector portion 37 which external leads contact, at the same pitch as the external leads 33. The external leads 33 are disposed in the notched portions 47. As a result, since the external leads 33 are limited in movement by the notched portions 47, offset of the leads 33 can be prevented.

[Sixth Embodiment]

Figure 18:
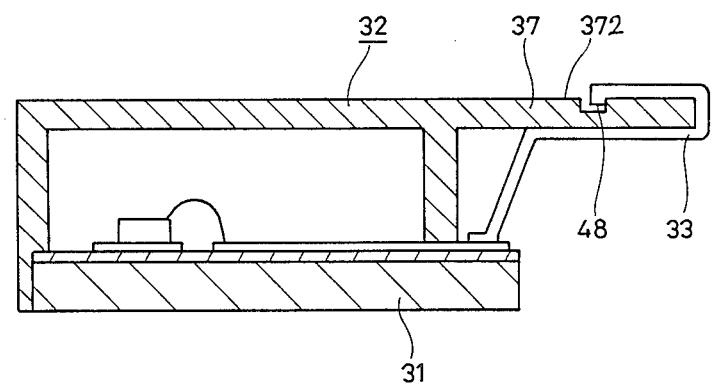
FIG. 18 is a diagram showing a hybrid integrated circuit device according to a sixth embodiment of the present invention.

FIG. 18 illustrates a sixth embodiment. The present embodiment is an improvement of the connector portion 37 shown in FIGS. 13 to 15. In the present embodiment, a hole 48 is provided near the intermediate portion of a surface 372 opposite to a major surface of a connector portion 37 in which the tip portions of the external leads 33 are located, at the same pitch as the external leads 33. The tip portions of the external leads 33 extending to the second major surface 372 of the connector portion 37 are bent toward and inserted into the hole 48. Thus, the same effect of preventing offset as described above can be obtained.

[Seventh Embodiment]

Figure 19:
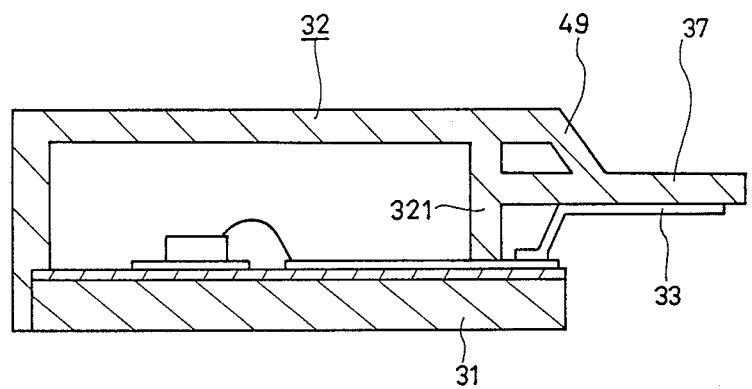
FIG. 19 is a diagram showing a hybrid integrated circuit device according to a seventh embodiment of the present invention.

FIG. 19 illustrates a seventh embodiment. The present embodiment is an improvement of a casing member 32. In this embodiment, the connector portion 37 is formed to be projected from the intermediate portion of a frame portion 321 in the casing member 32, so that spacing between a metal substrate 31 and a connector portion 37 can be decreased. In this case, the connector portion 37 is supported by a supporting member 49. Although in the present embodiment, the connector portion 37 is projected from the intermediate portion of the frame portion 321, the casing member 32 of an arbitrary shape may be formed by a metal mold.

[Eighth Embodiment]

Figure 20:
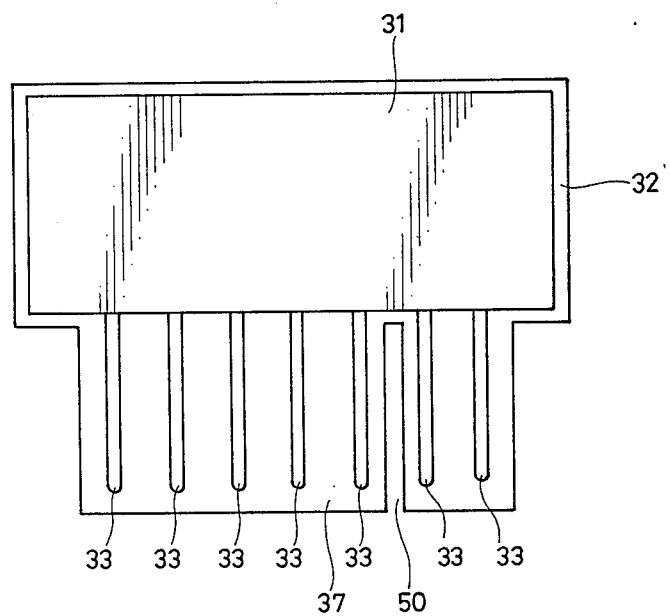
FIG. 20 is a diagram showing a hybrid integrated circuit device accoridng to an eighth embodiment of the present invention.

FIG. 20 illustrates an eighth embodiment. The present embodiment is an improvement of a connector portion 37. In the present embodiment, a slit 50 is formed between external leads 33 arranged on the connector portion 37. The slit 50 serves to prevent erroneous insertion into a print board.

[Ninth Embodiment]

Figure 21:
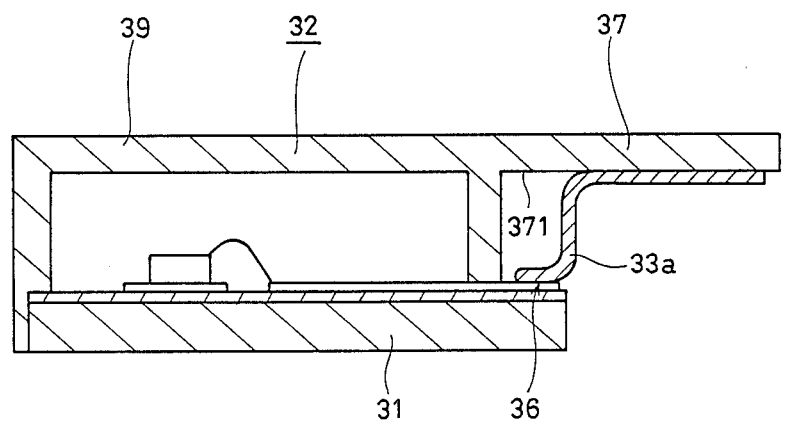
FIG. 21 is a diagram showing a hybrid integrated circuit device according to a ninth embodiment of the present invention.
Figure 22:
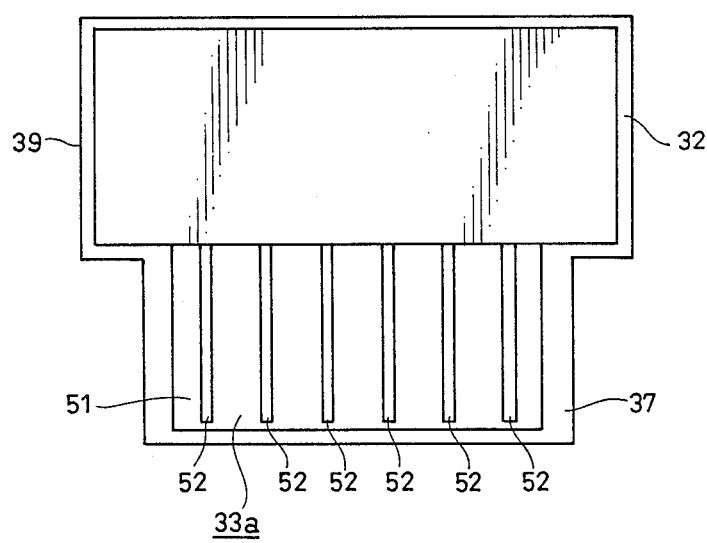
FIG. 22 is a plan view of the hybrid integrated circuit device shown in FIG. 21.
Figure 23:
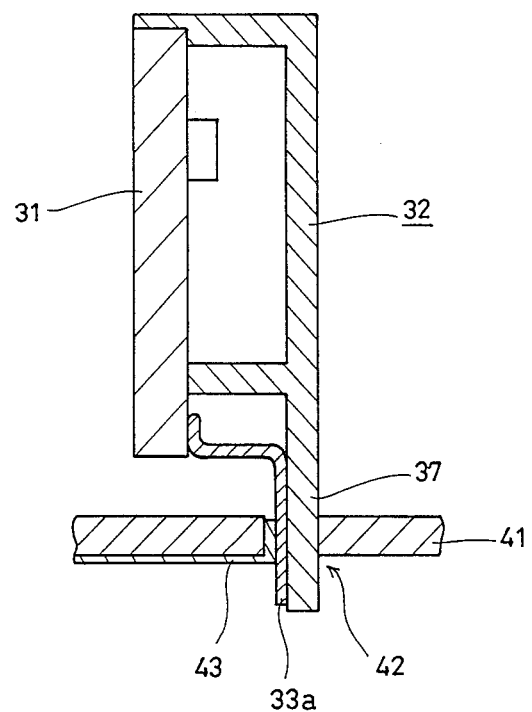
FIG. 23 is a cross sectional view of the hybrid integrated circuit device shown in FIG. 21 which is inserted into a print board.

A ninth embodiment is illustrated in FIGS. 21, 22 and 23. FIG. 21 is a cross sectional view of a hybrid integrated circuit device according to the present embodiment, FIG. 22 is a plan view thereof, and FIG. 23 is a cross sectional view of the hybrid integrated circuit device according to the present embodiment which is inserted into a print board. The present embodiment is an improvement of external leads 33. In the present embodiment, an external lead comprises a flexible lead 33a. The flexible lead 33a comprises a heat resisting resin film 51, such as polyimide and polyamide and conductive paths 52 which are formed by adhering copper foil, for exmaple, to the film 51 and etching it to be a pattern of a desired shape. Teh conductive paths 52 have an arbitrary pattern. According to the present embodiment, a plurality of substantially straight-line conductive paths 52 are formed. Since the flexible lead 33a is extremely thin, a connector portion 37 is formed to have the same thicknes as that of a print board into which the connector portion 37 is to be inserted.

One ends of the conductive paths 52 formed on the flexible lead 33a are soldered to the conductive pads 36. The flexible lead 33a is connected to a major surface 371 of the connector portion 37 by a liquid adhesive to lie on the major surface 371 from the intermediate portion of the connector portion 37 to the tip portion of the connector portion 37. Although in the present embodiment, the flexible lead 33a is first connected to the pads 36 of the metal substrate 31, the flexible lead 33a may be connected to the conductive pads 36 after the flexible lead 33a is adhered in advance to the connector portion 37 and the substrate 31 and the casing member 32 are formed integrally with each other.

As shown in FIG. 23, the connector portion 37 in the casing member 32 is inserted into an insertion hole 42 of a print board 41. If and when an electrode 43 formed on the print board 41 is formed to extend to the insertion hole 42, the electrode 43 and the flexible lead 33a can be connected to each other by simply inserting the connector portion 37 into the hole 42.

Since the flexible lead 33a is membranous and extremely thin, the flexible lead 33a catch nowhere when the hybrid integrated circuit device according to the present embodiment is inserted into the print board 41, so that the hybrid integrated circuit device is easily inserted.

[Tenth Embodiment]

Figure 24:
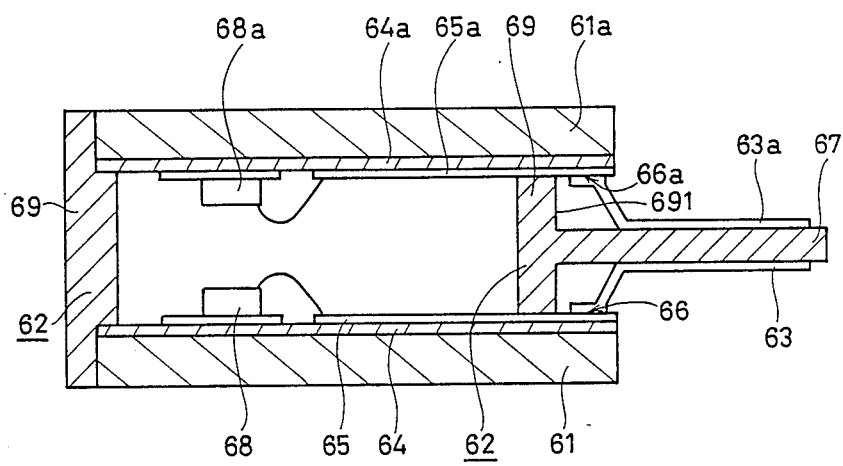
FIG. 24 is a diagram showing a hybrid integrated circuit device according to a tenth embodiment of the present invention.
Figure 25:
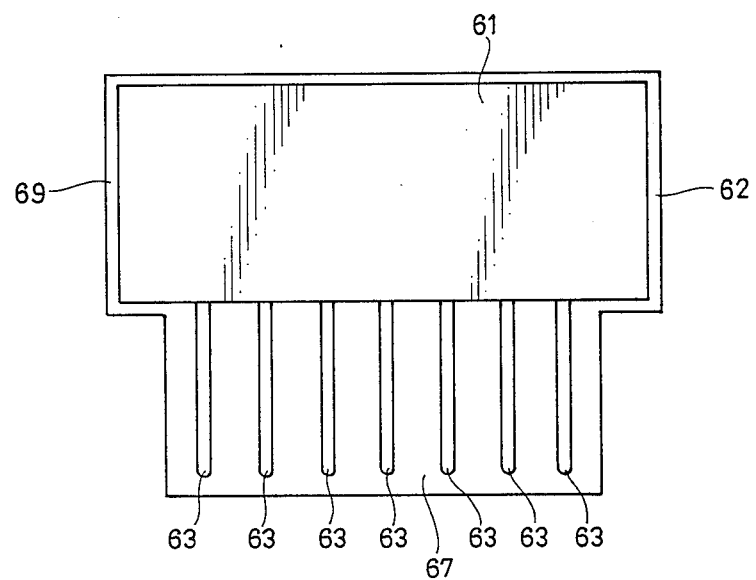
FIG. 25 is a plan view of the hybrid integrated circuit device shown in FIG. 24.
Figure 26:
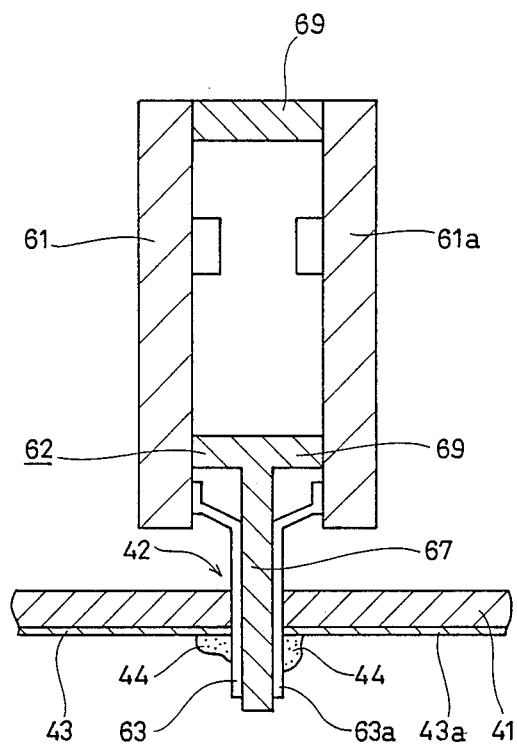
FIG. 26 is a cross sectional view of the hybrid integrated circuit device shown in FIG. 24 which is inserted into a print board.

FIG. 24 illustrates a tenth embodiment. A hybrid integrated circuit device according to the present embodiment comprises two opposed metal substrates 61 and 61a. Metal oxide films are formed on the respective surfaces of metal substrates 61 and 61a, insulating films 64 and 64a are formed of resin on the metal oxide films, and conductive paths 65 and 65a are formed on the insulating films 64 and 64a. Conductive pads 66 and 66a to which external leads 63 and 63a are connected are formed in the tip portions of the conductive paths 65 and 65a. In addition, a plurality of circuit elements 68 and 68a such as a semiconductor integrated circuit, a transistor and a chip part are connected to the conductive paths 65 and 65a. A casing member 62 is disposed such that the two metal substrates 61 and 61a are spaced from each other. Preferably, the circuit element 68 fixed to one metal substate 61 is opposed to the circuit element 68a fixed to the other metal substrate 61a. The casing member 62 comprises a sealing portion 69 and a connector portion 67. The sealing portion 69 is formed in a frame shape to separate the metal substrate 61 and 61a and surround the circuit elements 68 and 68a. The connector portion 67 is formed to be projected from the intermediate portion of one surface 691 of the sealing portion 69 and to extend beyond the respective ends of the metal substrates 61 and 61a. One ends of the external leads 63 and 63a are soldered on the conductive pads 66 and 66a. In addition, the external leads 63 and 63a are molded to be bent to contact the connector portion 67, so that the tip portions thereof are located in the vicinity of the tip of the connector portion 67. According to the present embodiment, the connector portion 67 is formed to be as wide as the sealing portion 69, or narrower than the sealing portion 69 as shown in FIG. 25. The width of the connector portion 67 can be changed according to the usage. The connector portion 67 is formed to be as thick as or thinner, by the thickness of the external leads 63 and 63a, than the print board into which the connector portion 67 is to be inserted. The metal substrates 61 and 61a and the casing member 62 are bonded by, for example, and adhesvie sheet, as described in the first embodiment. When the hybrid integrated circuit device according to the present embodiment is inserted into the print board, the connector portion 67 in the casing member 62 is inserted into an insertion hole 42 of a print board 41, and the external leads 63 and 63a are soldered on electrodes 43 and 43a of the print board 41, respectively, as shown in FIG. 26. According to the present embodiment, since both surfaces of the hybrid integrated circuit device are covered with metal, the shielding effect is large and the radiating effect is improved. Furthermore, since circuit elements are mounted on two metal substrates, mounting can be achieved in high density.

[Eleventh Embodiment]

Figure 27:
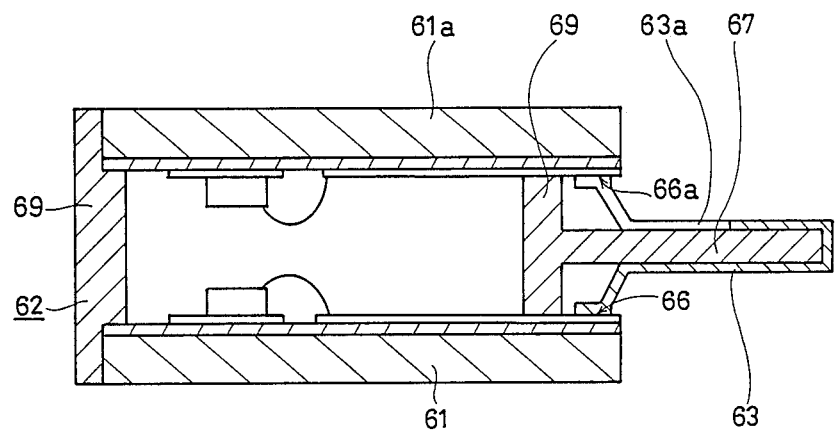
FIG. 27 is a cross sectional view showing a hybrid integrated circuit device according to an eleventh embodiment of the present invention.
Figure 28:
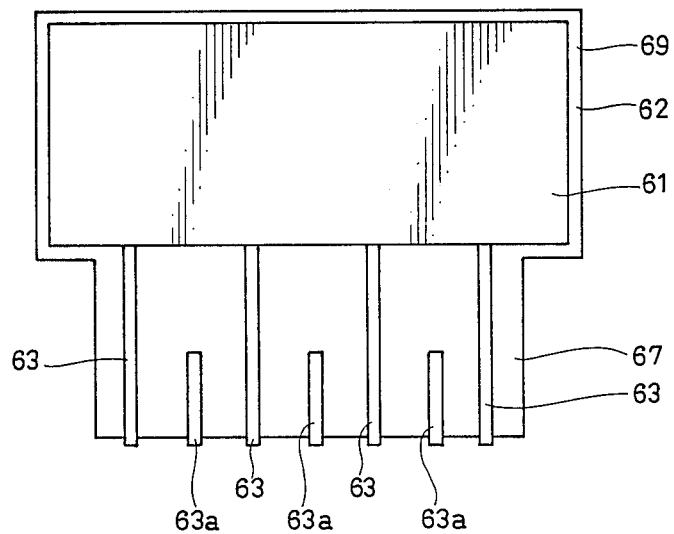
FIG. 28 is a plan view of the hybrid integrated circuit device shown in FIG. 27.
Figure 29:
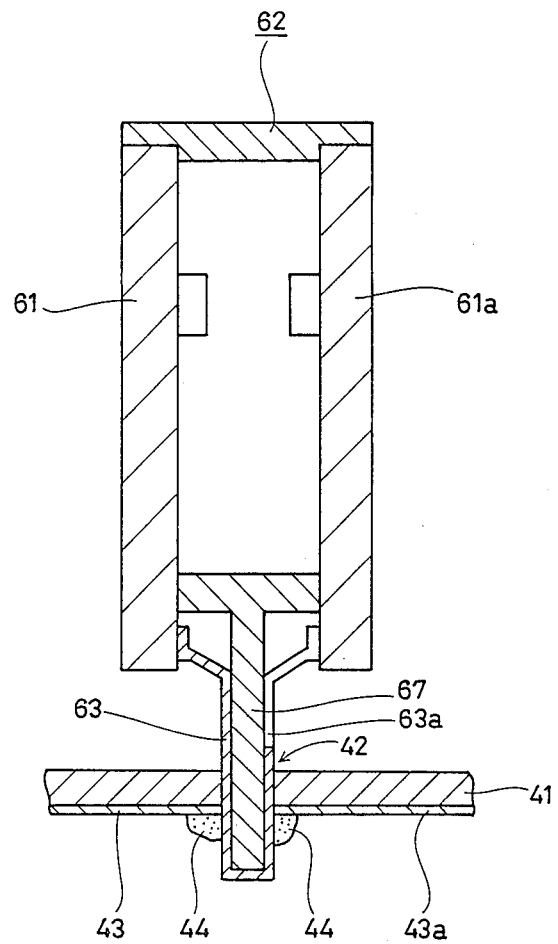
FIG. 29 is a cross sectional view of the hybrid integrated circuit device shown in FIG. 27 which is inserted into a print board.

An eleventh embodiment is illustrated in FIGS. 27, 28 and 29. FIG. 27 is a cross sectional view of a hybrid integrated circuit device according to the present embodiment, FIG. 28 is a plan view thereof, and FIG. 29 is a cross sectional view of the hybrid integrated circuit device according to the present embodiment which is inserted into a print board. In the present embodiment, as best shown in FIG. 28, external leads 63 and 63a are alternately folded on the side of another substrate. More specifically, conductive pads are not provided in positions opposed to each other, respectively, on metal substrates 61 and 61a, but alternately provided thereon. One ends of the external leads 63 and 63a are soldered on conductive pads 66 and 66a formed on the metal substrate 61 and 61a. The external leads 63 and 63a extend near the tip portion of a connector portion 67 along the connector portion 67, and bent to contact a surface on the opposite side of the connector portion in the end of the connector portion 67. At that time, since the conductive pads are alternately formed, one of the external leads 63 and 63a, does not contact the other external lead on a surface on the opposite side even if the external leads 63 and 63a are bent on the opposite side of the connector portion. As shown in FIG. 29, when the hybrid integrated circuit device according to the present embodiment is inserted into a print board, the connector portion 67 in a casing member 62 is inserted into an insertion hole 42 of a print board 41, and electrodes 43 and 43a of the print board 41 are connected by solder 44 on the external leads 63 and 63a, respectively. According to the present embodiment, since the external leads are bent in the connector portion as shown in FIG. 29, the connection areas of the external leads and the electrodes are large, so that an IC requiring large current and high breakdown voltage can be employed.

[Twelfth Embodiment]

Figure 30:
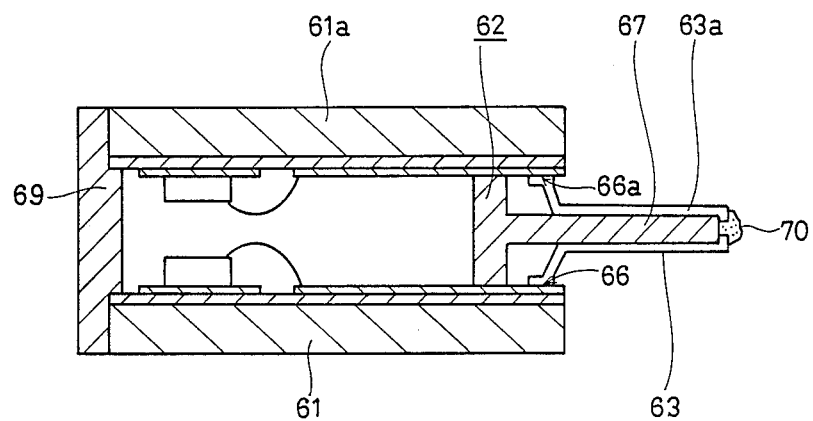
FIG. 30 is a cross sectional view showing a hybrid integrated circuit device according to a twelfth embodiment of the present invention.
Figure 31:
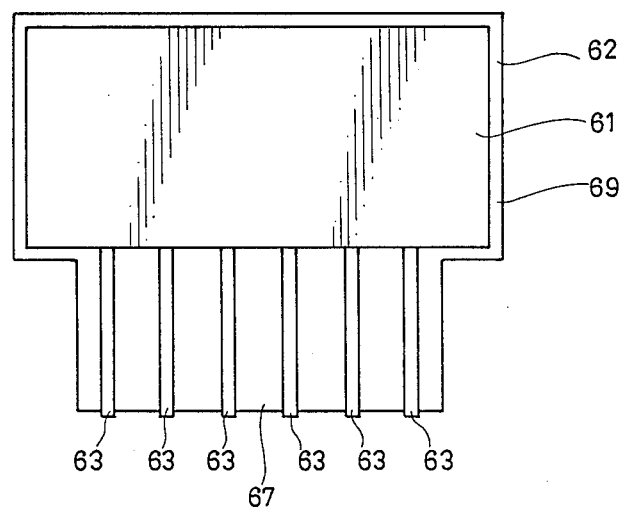
FIG. 31 is a plan view of the hybrid integrated circuit device shown in FIG. 30.
Figure 32:
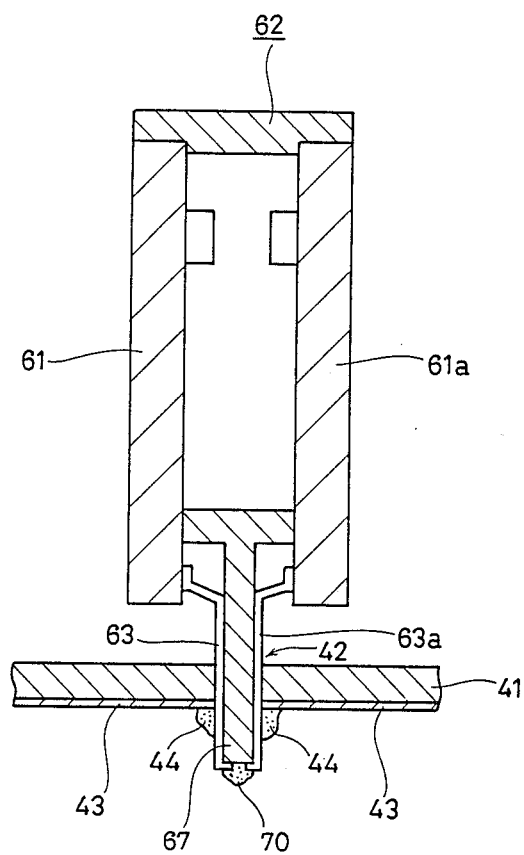
FIG. 32 is a cross sectional view of the hybrid integrated circuit device shown in FIG. 30 which is inserted into a print board.

A twelfth embodiment is illustrated in FIGS. 30, 31 and 32. FIG. 30 is a cross sectional view of a hybrid integrated circuit device according to the present embodiment, FIG. 31 is a plan view thereof, and FIG. 32 is a cross sectional view of a hybrid integrated circuit device according to the present embodiment which is inserted into a print board. In the present embodiment, one ends of the external leads 63 and 63a are soldered on conductive pads 66 and 66a provided on metal substrates 61 and 61a. The external leads 63 and 63a extend to an end of a connector portion 67 along the connector portion 67. In addition, the tip portions of the external leads 63 and 63a may be bent in the end of the connector portion 67. The tip portions of the external leads 63 and 63a opposed to each other which are extending to the end of the connector portion 67 are connected ot each other by solder 70. As a desirable method for connection in this case, the external leads are dipped in solder. All of the external leads opposed to each other need not be connected to each other. It is necessary to connect to each other only the external leads required for electrical connection. As shown in FIG. 32, when the hybrid integrated circuit device according to the present embodiment is inserted into a print board, the connector portion 67 in a casing member 62 is inserted into an insertion hole 42 of a print board 41, and an electrode 43 of the print board 41 is soldered on the external leads 63 and 63a.

According to the present embodiment, since two substrates can be electrically conducted by the external leads as shown in FIG. 32, it becomes unnecessary to use another lead as in the conventional example, so that working ability is improved.

[Thirteenth Embodiment]

Figure 33:
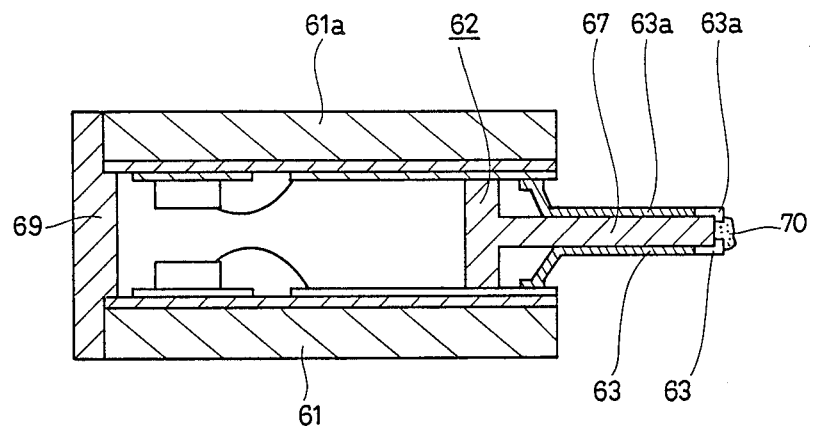
FIG. 33 is a cross sectional view showing a hybrid integrated circuit device according to a thirteenth embodiment of the present invention.
Figure 34:
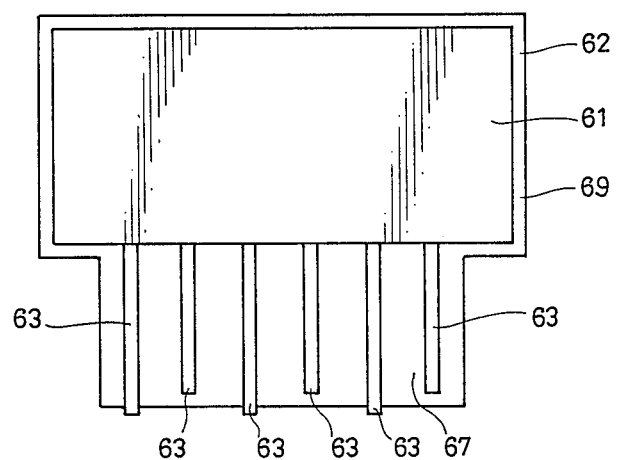
FIG. 34 is a plan view of the hybrid integrated circuit device shown in FIG. 33.
Figure 35:
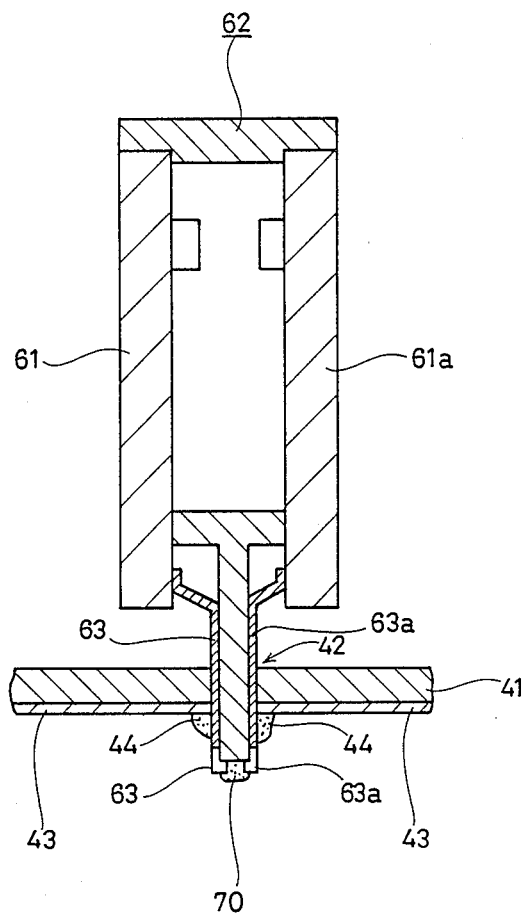
FIG. 35 is a cross sectional view of the hybrid integrated circuit device shown in FIG. 33 which is inserted into a print board.

A thirteenth embodiment is illustrated in FIGS. 33, 34 and 35. FIG. 33 is a cross sectional view of a hybrid integrated circuit device according to the present embodiment, FIG. 34 is a plan view thereof, and FIG. 35 is a cross sectional view of the hybrid integrated circuit device according to the present embodiment which is inserted into a print board. In the above described twelfth embodiment, all of the external leads opposed to each other are connected to each other. In the present embodiment, external leads opposed to each other are alternately connected to each other. More specifically, a long external lead and a short external lead are alternately connected to conductive pads of a metal substrate, and the long external lead is connected to a lead opposed to the long external lead by solder 70. As shown in FIG. 35, when the hybrid integrated circuit device according to the present embodiment is inserted into a print board, a connector portion 67 in a casing member 62 is inserted into an insertion hole 42 of a print board 41, and an electrode 43 of the print board 41 is connected to external leads 63 and 63a by solder, similarly to the twelfth embodiment.

As described in the foregoing, according to the present invention, since a connector portion comprising an insulating material is provided in a hybrid integrated circuit device, the hybrid integrated circuit device and a print board are handled in the same manner, so that insertion can be simply made. In addition, since external leads are supported by the connector portion, the leads can be prevented from being bent, so that the hybrid integrated circuit device can be automatically inserted into the print board by an automatic inserting apparatus. Furthermore, since in the hybrid integrated circuit device according to the present invention, a single metal substrate and a casing member are connected to each other, the effect of distortion or the like caused by thermal expansion can be completely neglected, as compared with the conventional hybrid integrated circuit device in which a plurality of substrates having different properties are formed integrally with each other.

Additionally, in a hybrid integrated circuit device comprising two metal substrates, both surfaces are covered with metal, so that the shielding effect is increased and the radiating effect is improved. In addition, since circuit elements are mounted on the two substrates, mounting can be achieved in high density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A hybrid integrated circuit device comprising:
    a metal substrate having an end,
    an insulating film formed on said metal substrate,
    conductive paths formed on said insulating film and extending to said end of said metal substrate,
    a plurality of circuit elements connected to said conductive paths,
    conductive pads formed in said end of said metal substrate and connected to said conductive paths,
    a casing having a sealing portion formed of an insulating material surrounding said circuit elements, and a connector portion projected from said sealing portion and separated from and extending approximately parallel with said metal substrate, and
    external leads having one ends connected to said conductive pads and extending to contact said connector portion of said casing.

2. A hybrid integrated circuit device according to claim 1, wherein
    said connector portion comprises notched portions formed along said external leads, and
    said external leads are disposed in said notched portions.

3. A hybrid integrated circuit device according to claim 1, wherein
    said connector portion comprises openings, and
    said external leads have the other ends bent toward and inserted into said openings of said connector portion.

4. A hybrid integrated circuit device according to claim 1, wherein
    said connector portion has a tip portion, a first major surface opposed to said metal substrate and a second major surface opposite to said first major surface, and
    said external leads extend along said first major surface are bent to surround said tip portion of said connector portion, and extend to said second major surface.

5. A hybrid integrated circuit device according to claim 4, wherein
    said connector portion comprises notched portions formed along said external leads on said first major surface and said second major surface thereof, and
    said external leads are disposed in said notched portions.

6. A hybrid integrated circuit device according to claim 4, wherein
    said connector portion comprises openings formed on said second major surface, and
    said external leads have the other ends bent toward and inserted into said openings of said connector portion.

7. A hybrid integrated circuit device according to claim 1, wherein
    said sealing portion comprises a frame portion having a predetermined length, and
    said connector portion is projected from the intermediate portion of said frame portion.

8. A hybrid integrated circuit device according to claim 1, wherein
    said connector portion comprises at least one notched portion for defining the direction of inserting said connector portion.

9. A hybrid integrated circuit device according to claim 1, wherein each of said external leads comprises a flexible resin film and a conductive path formed said resin film.

10. A hybrid integrated circuit device comprising:
    a first and second metal substrates each having an end and arranged opposed to each other at predetermined spacing,
    a casing having a sealing portion for separating said first metal substrate and said second metal substrate at said predetermined spacing and sealing a region excluding the vicinity of said end, of a region interposed between said first metal substrate and second metal substrate, and a connector portion projected from near the intermediate portion of said sealing portion, separated from and extending approximately parallel with said first and second metal substrates and having one surface and the other surface, and
    first and second insulating films formed on said first and second metal substrates, respectively,
    first and second conductive paths formed on said first and second insulating films and extending to said respective ends of said first and second metal substrates,
    first circuit elements connected to said first conductive paths,
    second circuit elements connected to said second conductive paths,
    first conductive pads formed in said end of said first metal substrate and connected to said first conductive paths, second conductive pads formed in said end of said second metal substrate and connected to said second conductive paths, first external leads having one ends connected to said first conductive pads and extending to contact said one surface of said connector portion in said casing, and second external leads having one ends connected to said second conductive pads and extending to contact said other surface of said connector portion in said casing.

11. A hybrid integrated circuit device according to claim 10, wherein said connector portion has a tip portion, and said first external leads and said second external leads are alternately arranged, folded to surround said tip portion of said connector portion and extend to said other surface or said one surface.

12. A hybrid integrated circuit device according to claim 10, wherein said connector portion has a tip portion, and said first external leads and said second external leads are arranged opposed to each other, at least one pair of leads opposed to each other being electrically connected to each other in said tip portion of said connector portion.

13. A hybrid integrated circuit device according to claim 12, wherein said first external leads and said second external leads opposed to said first external leads are electrically connected alternately to each other.

* * * * *